United States Patent
Seitel et al.

(10) Patent No.: US 7,428,095 B1
(45) Date of Patent: Sep. 23, 2008

(54) OPTICAL POWER LIMITER FOR A DIODE

(75) Inventors: Steven C. Seitel, Ridgecrest, CA (US); Jerome B. Franck, Ridgecrest, CA (US); Marion J. Soileau, Denton, TX (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 06/385,189

(22) Filed: Jun. 1, 1982
(Under 37 CFR 1.47)

(51) Int. Cl.
*G02B 26/00* (2006.01)
(52) U.S. Cl. ........................ 359/297; 359/267
(58) Field of Classification Search ............... 350/267, 350/312, 353, 354, 363; 359/297, 267, 312, 359/353, 354, 363
See application file for complete search history.

(56) References Cited

U.S. PATENT DOCUMENTS

| | | | | | |
|---|---|---|---|---|---|
| 3,433,555 A | * | 3/1969 | Tomlinson | ................. | 350/363 |
| 3,620,597 A | * | 11/1971 | Schwartz | ................. | 350/354 |
| 3,814,503 A | * | 6/1974 | Milam | ................. | 350/363 |
| 3,982,206 A | * | 9/1976 | Poulsen | ................. | 350/363 |
| 3,999,144 A | * | 12/1976 | Bret | ................. | 350/354 |
| 4,194,813 A | * | 3/1980 | Benjamin et al. | ................. | 350/363 |

\* cited by examiner

*Primary Examiner*—Mark Hellner
(74) *Attorney, Agent, or Firm*—Laura R. Foster; Melvin J. Sliwka

(57) ABSTRACT

An optical power limiter is designed for use with high gain optical systems by providing intensity reduction by the use of a non-linear fluid. As the intensity of light increases in the fluid, the index of refraction becomes non-linear very rapidly. This results in a plasma being formed within the fluid. Picosecond reaction time is provided. Recovery time of less than a microsecond is required for the system to return to its starting point.

5 Claims, 1 Drawing Sheet

OPTICAL POWER LIMITER FOR A DIODE

BACKGROUND OF THE INVENTION

1. Field of the Invention

This invention is for high gain optical systems designed for use with low level light sources. In particular, the system is designed for broadband application with picosecond reaction time. This rapid reaction is due to non-linear optical processes dependent on the electric field intensity.

2. Description of the Prior Art

The requirement to limit light intensity for a given application, such as photography, is well known. In general, mechanical or electro-optical shutters and similar light limiting devices are used to prevent optical burn-out of detectors through overexposure of light intensity. The fastest known reaction times are in the order of nanosecond reaction times. Typical modern reaction systems can be destroyed in picoseconds with rapid surges in optical intensity. Such reaction time is of major significance when lasers now provide means for intensity bursts which may themselves last only a few picoseconds.

SUMMARY OF THE INVENTION

The device provides a reusable limiter capable of limiting optical light intensity within picoseconds of the intensity's initiation. Unusually high bursts of intensity are thus prevented from causing damage to sensitive detectors. Sensitive detectors include the human eye. Protection is provided by the use of an optical cell containing a non-linear fluid. Incoming light is focused by means of a lens or other optical system so that a focal waist is formed within the fluid.

At low intensities, the index of refraction is not altered appreciably by the incoming radiation, which passes through the cell unattenuated. For sufficiently high intensities, the index of refraction is altered in a non-linear fashion that causes the radiation to be self-focused to a still smaller waist. This further increases the intensity, which in turn increases the self-focusing, etc. This unstable process continues until the intensity is sufficient to cause optical breakdown of the fluid. At this point, a plasma is formed which effectively attenuates the radiation. Upon reduction of the intensity, the index of refraction decays rapidly to its original value. The transmission of the cell returns to normal with a recovery time determined by the hydrodynamic properties of the fluid, typically less than a microsecond. This contrasts to the rise time of the plasma, which can occur in a few picoseconds.

Light whose intensity has been limited in this manner is then passed through further desired optical systems. These systems may include a recollimating lens or a bandpass filter with a specific spectral line being observed. Light passing through such a lens or bandpass filter is then incident on an optical detector such as a photodiode, TV camera, human eye, or other device.

Accordingly, it is an object of the present invention to provide a high gain optical power limiter with picosecond reaction time to protect sensitive optical detection devices.

DESCRIPTION OF THE PREFERRED EMBODIMENT

Figure 1:
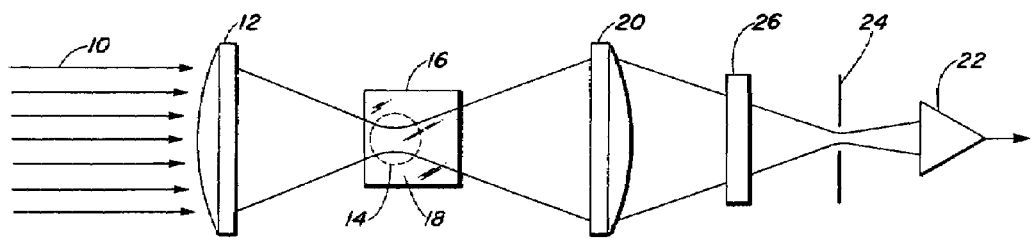
FIG. 1 is a ray diagram of the present invention including block illustrations of the stages of the present invention.

In FIG. 1 the present invention takes an input light beam 10 which can be either monochromatic light, such as a laser system, or broadband background light typically observed in astronomical uses. The light passes through a first lens 12 where it is focused to a focal waist 14 within a liquid cell 16. Within liquid cell 16, a non-linear fluid 18 is laced. Non-linear fluid 18 may be any fluid whose index of refraction is dependent in a non-linear fashion on the electric field intensity within the fluid.

Acceptable working non-linear fluids have been found to be pure carbon disulfide, $CS_2$, or a mixture of carbon disulfide and ethanol. These fluids follow the general equation $$N=N+N_0+N_2E^2$$

where
$N$=the index of refraction at a given location and point in time within liquid cell 16,
$N_0$ represents the index of refraction of the non-linear fluid without an electric field present,
$N_2$ represents a minimum constant with any electric field present, and
$E^2$ represents the intensity of the electric field within liquid cell 16.

This equation shows that for the focal waist 14 of light beam 10 in liquid cell 16, as the intensity increases, the index of refraction becomes quadratically greater. For sufficiently high intensities, catastrophic self-focusing occurs. At this point, a plasma is formed in focal waist region 14 of liquid cell 16 such that most of the light intensity is absorbed by the plasma. Only a small amount of the present intensity passes through focal waist region 14 and exits from liquid cell 16.

The exiting light can then be refocused by lens 20 which serves to direct the light along a desired optical path. This light can then be observed by a photodetector 22, such as a silicon photodiode and measured. In FIG. 1, detector 22 is shown used in combination with a pinhole screen 24 and a bandpass filter 26. Both pinhole 24 and bandpass filter 26, such as a 1.06 µm filter, merely represent improvements in detector performance for a specific application. For example, in laser rangefinder systems, a specific laser wavelength will be monitored. Information about the target is provided by the arrival time of light received. This light can be either reflected light or emitted light. For emitted light, there is a definite destructive threshold if the laser beam looks directly down the system. Detector burn-out would rapidly occur. In the present invention, such burn-out can be avoided despite bandpass filter 26 allowing the desired laser wavelength to reach detector 22. A well-focused image via pinhole 24 can be monitored on detector 22 without fear of detector burn-out.

The transmission of energy through liquid cell 16 is approximately linear at low levels of intensity. It is only as the intensity increases that the quadratic effect causes significant departure from linear performance. Because of the instantaneous reaction between light and focal waist region 14 of non-linear fluid 18, picosecond reaction time is available. Laser pulses of less than 40 picoseconds have been limited effectively. Recovery time of non-linear fluid 18 for carbon disulfide is less than one microsecond. Without band-pass filter 26, the limiter reacts over a broadband because it responds to the electric field, E, rather than wavelength or frequency.

The reaction time is faster than has ever been achieved before and thus permits the limiter to function against intensity pulses which may themselves last only a few pico-seconds. The recovery of non-linear fluid 18 permits the limiter to be reusable.

A specific cut-off level for intensity reaction can be determined by varied concentration of carbon disulfide, $CS_2$, and ethanol. Different combinations will permit different cells to provide different response curves. The limiter is of relatively small size and thus can be retrofitted into existing optical systems while providing the cost efficiencies not possible in electric automatic gain circuits.

Figure 2:
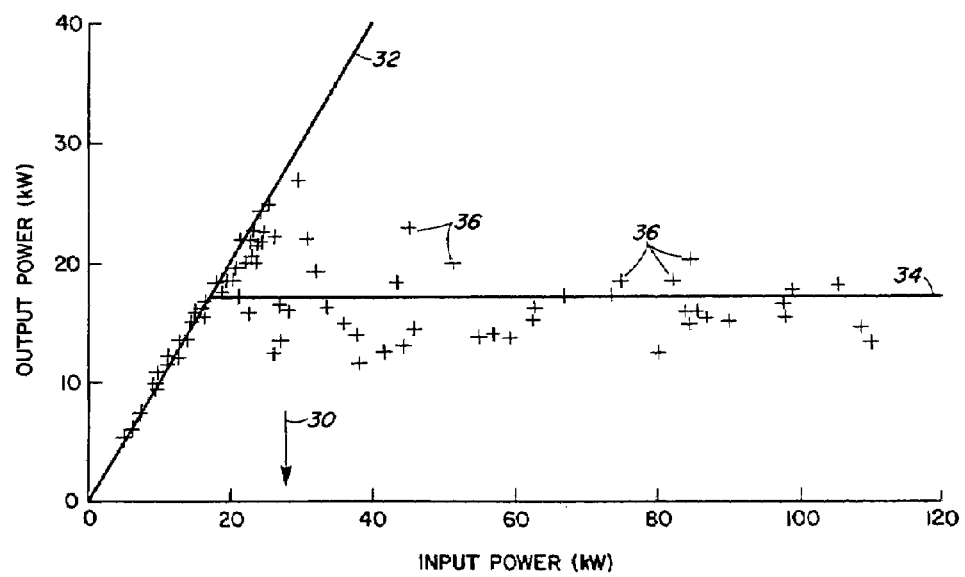
FIG. 2 is a graph of output power versus input power for the present invention's non-linear fluid cell.

FIG. 2 is a graph of output power from liquid cell 16 versus input power to liquid cell 16 for a liquid cell with only $CS_2$ as the working fluid. Arrow 30 represents the critical power threshold at which a plasma forms within the working fluid. For all input power levels greater than the one represented by arrow 30, a plasma will occur in focal waist region 14. Line 32 represents the power low intensity limit for linear behavior. As shown by line 32, without a change in the index of refraction, the output power can otherwise undergo rapid growth and overwhelm the system. Dashed line 34 represents the high intensity limit cut-off of the present invention. As shown by plotted points 36, as input power increases, the matching output power deviates from line 32 and follows cut-off limit line 34. For most applications, pure $Cs_2$ provides the lowest cut-off power. The cut-off power may be increased to any value desired by admixing various amounts of ethanol.

It is obvious to those skilled in the art that numerous modifications on the above invention may be made.

What is claimed is:

1. An optical power limiter for a diode, comprising:
   a first lens for focusing incident radiation at a focal waist;
   a fluid having the properties of an index of refraction which is non-linearly dependent upon the electric field intensity existing within the fluid, and which exhibits a plasma forming reaction in response to an electromagnetic field exceeding a predetermined strength;
   a liquid cell containing said fluid at said focal waist; and
   a second lens positioned for retransmitting radiation from said liquid cell along a desired optical path.

2. An optical power limiter for a diode as described in claim 1 where said non linear fluid comprises $CS_2$.

3. An optical power limiter for a diode as described in claim 2 where said non-linear fluid further comprises ethanol.

4. An optical power limiter for a diode as described in claim 1, further comprising:
   a spectral filter placed in the path of radiation retransmitted by said second lens for limiting radiation to a chosen spectral region and
   means for detecting said spectrally limited radiation.

5. An optical power limiter for a diode as described in claim 4 where said means for detecting is a silicon photodiode.

* * * * *